US008921956B2

(12) United States Patent
Dehe

(10) Patent No.: US 8,921,956 B2
(45) Date of Patent: Dec. 30, 2014

(54) MEMS DEVICE HAVING A BACK PLATE WITH ELONGATED PROTRUSIONS

(71) Applicant: Infineon Technologies AG, Neubiberg (DE)

(72) Inventor: Alfons Dehe, Reutlingen (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 13/750,941

(22) Filed: Jan. 25, 2013

(65) Prior Publication Data

US 2014/0210020 A1    Jul. 31, 2014

(51) Int. Cl.
*H01L 29/82* (2006.01)

(52) U.S. Cl.
USPC ........... 257/416; 257/415; 257/419; 257/443; 381/174; 381/175

(58) Field of Classification Search
USPC .................... 257/72, 419, 415–416, 680; 381/174–175, 191, 386, 423; 359/245, 359/290–291
See application file for complete search history.

(56) References Cited

U.S. PATENT DOCUMENTS

| | | | |
|---|---|---|---|
| 5,870,482 A | 2/1999 | Loeppert et al. | |
| 7,040,173 B2 | 5/2006 | Dehe | |
| 7,405,924 B2 | 7/2008 | Gally et al. | |
| 7,746,537 B2 | 6/2010 | Natarajan et al. | |
| 8,542,853 B2* | 9/2013 | Dehe et al. | 381/191 |
| 2005/0241944 A1 | 11/2005 | Dehe et al. | |
| 2006/0065436 A1 | 3/2006 | Gally et al. | |
| 2007/0261910 A1 | 11/2007 | Kasai et al. | |
| 2008/0104825 A1 | 5/2008 | Dehe et al. | |
| 2009/0016550 A1 | 1/2009 | Qiao | |
| 2012/0099753 A1 | 4/2012 | Van der Avoort et al. | |
| 2013/0223654 A1* | 8/2013 | Dehe et al. | 381/174 |

FOREIGN PATENT DOCUMENTS

WO    WO 8403410 A1    8/1984

OTHER PUBLICATIONS

Zou, Q., et al., "Design and Fabrication of Silicon Condenser Microphone Using Corrugated Diaphragm Technique", Journal of Microelectromechanical Systems, vol. 5, No. 3, Sep. 1996, pp. 197-204, IEEE.

Pedersen, "On Design of a Backplate used in a Hearing Aid", Department of Solid Mechanics, Technical University of Denmark, Technical P[roceedings of the Third International Conference on Modeling and Simulation of Microsystems, 2000, pp. 624-627.

* cited by examiner

*Primary Examiner* — Dung A. Le
(74) *Attorney, Agent, or Firm* — Slater & Matsil, L.L.P.

(57) ABSTRACT

MEMS devices with a rigid backplate and a method of making a MEMS device with a rigid backplate are disclosed. In one embodiment, a device includes a substrate and a backplate supported by the substrate. The backplate includes elongated protrusions.

17 Claims, 13 Drawing Sheets

US 8,921,956 B2

MEMS DEVICE HAVING A BACK PLATE WITH ELONGATED PROTRUSIONS

TECHNICAL FIELD

The present invention relates generally to a system and a method for manufacturing a micro-electromechanical system (MEMS) package, and, in particular embodiments, to a system and a method for manufacturing a MEMS microphone package.

BACKGROUND

Over the past years a desire for smaller electronic form factors and power consumption along with increased performance has driven an integration of device components. One area where integration took place is area of MEMS devices. More specifically, microphones in electronic devices such as, e.g., cell phones, laptops, and tablets are predominantely MEMS microphones.

A MEMS (Micro-Electrical-Mechanical System) microphone comprises a pressure-sensitive diaphragm disposed in a silicon chip. The MEMS microphone is sometimes integrated with a preamplifier into a single chip. MEMS microphones may also include an analog-to-digital converter (ADC) circuit making it a digital MEMS microphone.

SUMMARY OF THE INVENTION

In accordance with an embodiment a device comprises a substrate and a backplate supported by the substrate, wherein the backplate comprises elongated protrusions.

In accordance with another embodiment a MEMS structure comprises a movable electrode supported by a substrate and a counter electrode supported by the substrate, wherein the counter electrode comprises elongated protrusions.

In accordance with yet another embodiment a method for manufacturing a MEMS structure comprises forming a sacrificial layer over a substrate and forming recesses in the sacrificial layer, the recesses comprising a first type of recess and a second type of recess, the first type of recess being different than the second type of recess. The method further comprises filling the first and second types of recesses with a conductive material, removing a portion of the substrate underneath the conductive material and removing the sacrificial layer.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to embodiments in a specific context, namely sensors or microphones. The invention may also be applied, however, to other MEMS structures or transducers such as pressure sensors, RF MEMS, accelerometers and actuators.

Figure 1A:
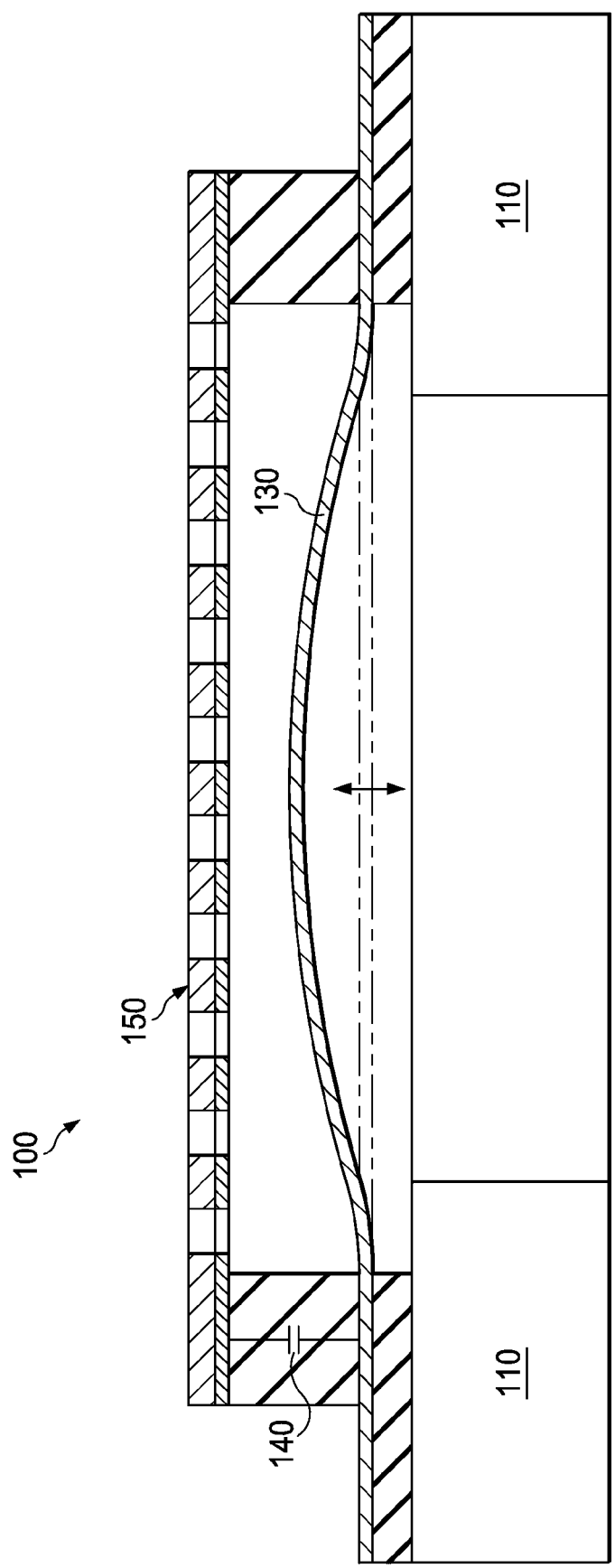
FIGS. 1a and 1b show a microphone device that can include embodiments of the present invention.
Figure 1B:
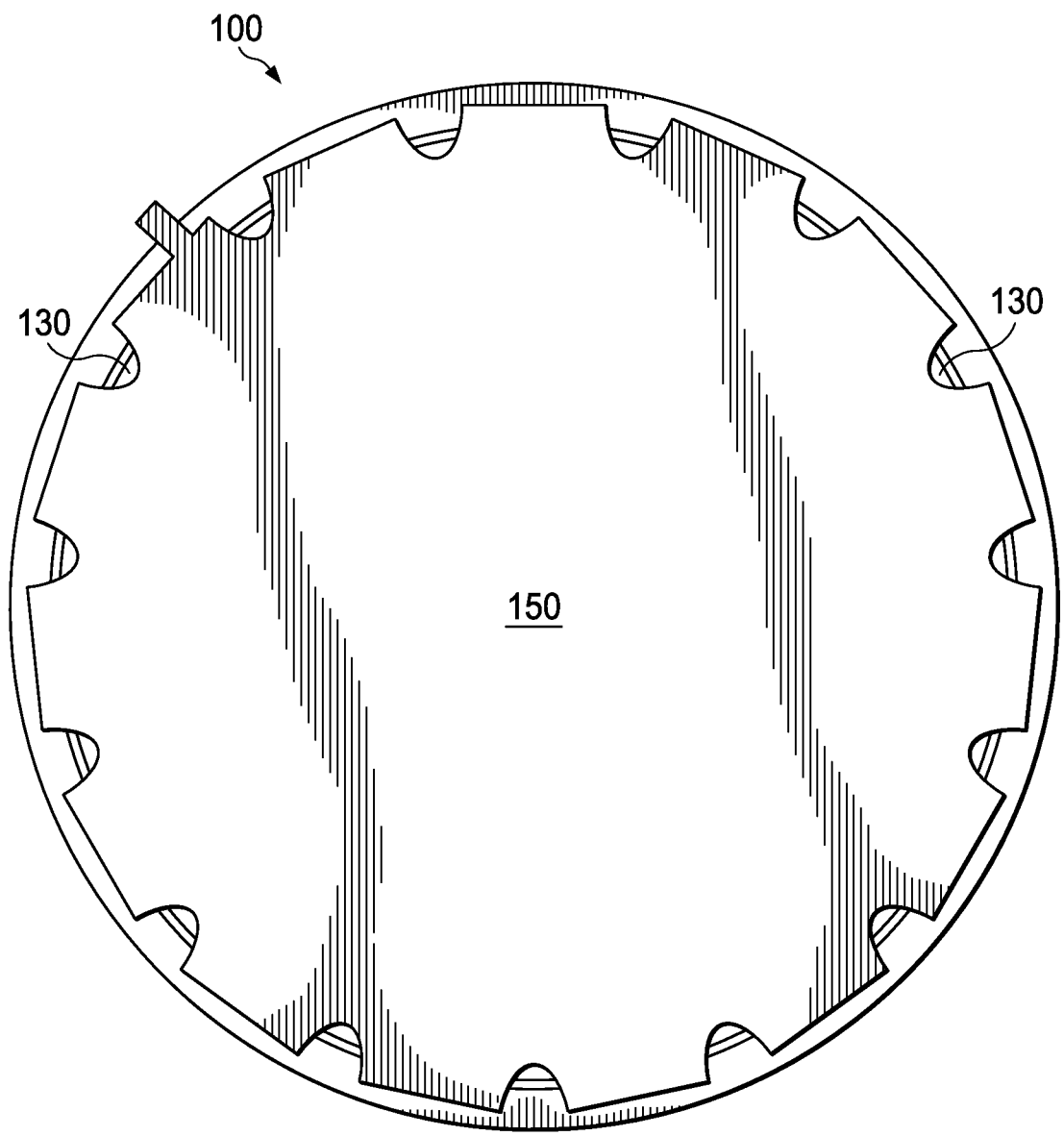

FIG. 1a shows a cross sectional view of a microphone device 100. The membrane 130 and the backplate 150 form a static or parasitic capacitance along the support structure 140 (shown with a capacitor sign in FIG. 1a). To decrease the static capacitance, the membrane 130 and the backplate 150 may only partially overlap as shown in FIG. 1b. The backplate 150 of the microphone device 100 is typically rigid. In conventional devices, the rigidity of the backplate 150 can be increased by increasing the thickness of the backplate 150 and therefore increasing the bending stiffness. However, a problem with increasing the stiffness of the backplate 150 is that a thicker backplate increases the resistance of the perforation holes since they are thicker now and therefore the noise of the microphone device 100.

Alternatively, the rigidity of the backplate 150 can be increased by increasing the tensile stress of a stress layer in the backplate 150. However, a problem with increasing the tensile stress is that it influences the membrane spring constant. Moreover, in both cases stress is concentrated in the anchor region where the backplate is connected to the substrate 110. The anchor region is typically the area where a fracture starts in case of extreme overload pressure.

Embodiments of the invention increase the rigidity of the backplate 150 by, for example, including elongated protrusions. As such, a MEMS structure with a stiff backplate and a long reliable lifetime can be achieved. These embodiments can be used in conjunction with the techniques described above.

An embodiment of the invention provides elongated protrusions in the backplate, for example of the MEMS device shown in FIGS. 1a and 1b. In various embodiments the elongated protrusions are disposed in, at or around the anchor regions. The elongated protrusions may be placed at the areas with maximum stress concentration. The elongated protrusions may be disposed on the backplate facing towards the membrane or facing away from the membrane.

An advantage is that the elongated protrusions are fabricated in the same process as the anti-sticking bumps. A further advantage is that a selective increase in backplate thickness increases the bending stiffness of the backplate by a power of three (e.g., two times the backplate thickness adds eight times bending stiffness). Therefore, the thickness of the backplate does not need to be increased over the entire backplate surface but only at strategic important locations such as the anchor regions.

Figure 2A:
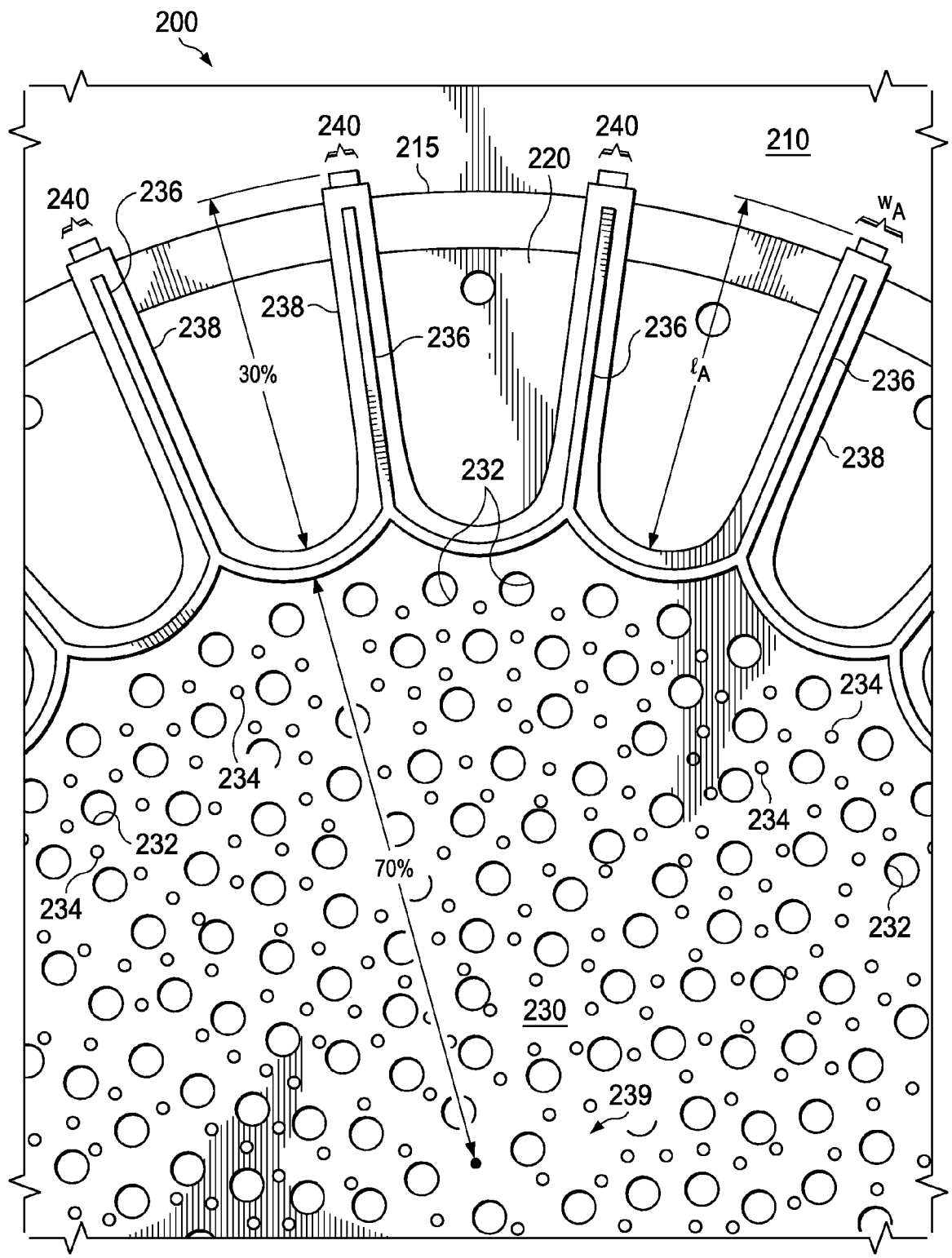
FIG. 2a shows a top view of an embodiment of backplate of a MEMS structure comprising elongated protrusions.

FIG. 2a shows a top view of an embodiment of a MEMS structure 200. The MEMS structure 200 comprises a substrate 210, a membrane 220 and a backplate 230. The substrate 210 comprises a rim 215 and the backplate 230 is anchored or bridged to the rim 215 of the substrate 210 in anchor regions 240. An opening (or back-volume or sound port) is disposed in the substrate 210 beneath the membrane 220 and the backplate 230 (not shown).

The membrane 220 and the backplate 230 are mechanically connected to a substrate 210 along their circumference. The membrane 220 and the backplate 230 may be circular or square. Alternatively, the membrane 230 and the backplate 260 may comprise any geometrical suitable form.

The substrate 210 may include a bulk mono-crystalline silicon substrate (or a layer grown thereon or otherwise formed therein), a {110} silicon, a {100} silicon, a silicon-on-insulator (SOI), or a germanium-on-insulator (GeOI). In various embodiments, the substrate 210 may include blanket epitaxial layers. The substrate 210 may comprise a compound semiconductor substrate such as indium antimonide, indium arsenide, indium phosphide, gallium nitride, gallium arsenide, gallium antimonide, lead telluride, silicon germanium, silicon carbide or combinations thereof or glass.

The movable electrode or membrane 220 may comprise a conductive material such as polysilicon, doped polysilicon, a metal, or combinations thereof. Alternatively, the membrane 220 may comprise at least one or more additional dielectric layers.

The backplate or counter electrode 230 may comprise a conductive material such as polysilicon, doped polysilicon, a metal, or combinations thereof. Alternatively, the backplate 230 may comprise one or more additional layers. The additional layers may comprise a dielectric layer such as a silicon nitride layer, a silicon oxynitride layer, an oxide layer or a polymeric layer. The dielectric layer may be configured to provide tensile stress. The backplate 230 is perforated 232 to reduce damping effects. The membrane 220 may be disposed below or above the backplate 230.

The backplate 230 comprises anti-sticking bumps 234. The anti-sticking bumps 234 may be circular, rectangular or square regions with protruding portions. The protruding portion may be a middle tip or middle point.

The backplate 230 further comprises elongated protrusions such as stiffening ridges, stiffening lines, stiffening routes, stiffening tracks and/or corrugation lines 236. The elongated protrusions 236 are longer and/or wider than the anti-sticking bumps 234. The elongated protrusions 236 are disposed on the anchor fingers, anchor bridges, attachment regions, anchor bars or anchor spokes 238 of the backplate 230. Alternatively, the elongated protrusions are only or are also disposed in the central region 239 of the backplate 230. The anchor fingers, anchor bridges or attachment regions 238 may comprise 10% to 40% of a radius of the backplate 230 and the central region 239 may comprise 60% to 90%. In one particular embodiment, the anchor fingers 238 comprise 30% of the radius of the backplate 230 and the central region 239 comprises 70% of the radius.

The anchor fingers 238 may be equally spaced from each other and may comprise the same width wA and the same length lA. Alternatively, the anchor fingers 238 may comprise different widths wA and different lengths lA, and may be spaced in different distances from each other.

In one embodiment the elongated protrusions 236 are disposed on the backplate 230 in a radial direction. The elongated protrusions 236 may be disposed on the backplate 230 close to a circumference of the backplate 230 and may overlie a rim region 215 and the anchor bridge 238. In one embodiment the elongate protrusions 236 overlie and go through a center point of the backplate 230.

FIG. 2a shows a single elongated protrusion 236 per anchor bridge 238. The elongated protrusions 236 may comprise half the width of the anchor bridge 238. Alternatively, the elongated protrusions 236 may comprise other width dimensions. The elongated protrusions 236 may be connected to each other through peripheral regions of the central region 239.

Figure 2B:
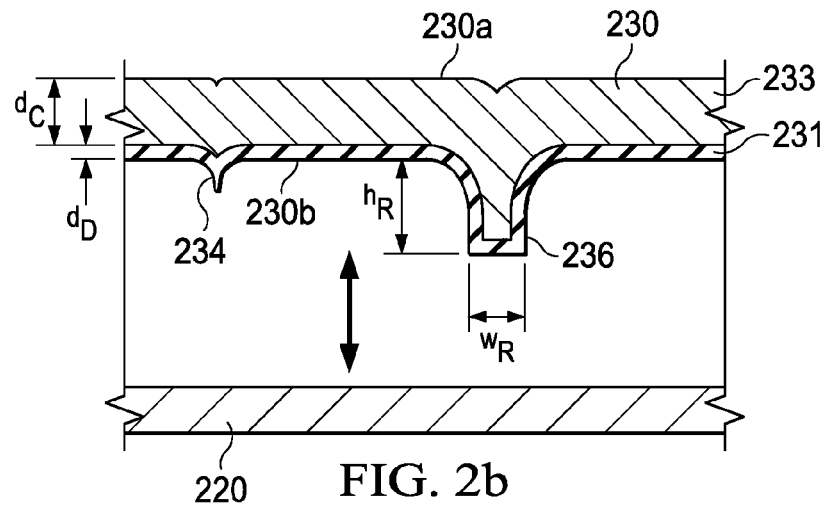
FIGS. 2b and 2c show cross sectional views of an embodiment of a backplate and a membrane comprising elongated protrusions.

FIG. 2b shows an embodiment of a cross sectional view of a portion of a backplate 230 and the membrane 220. The backplate 230 comprises an anti-sticking bump 234 and an elongated protrusion 236 (e.g., stiffening ridges, stiffening lines, stiffening routes or stiffening tracks). The backplate 230 comprises a dielectric layer 231. The dielectric layer 231 may comprise a dielectric material such as silicon nitride, silicon oxynitride, silicon oxide or a polymeric. The dielectric layer 231 may be tensile stressed. The backplate 230 is perforated to reduce damping effects (not shown).

The backplate 230 further comprises a conductive layer 233. The conductive layer 233 may comprise a polysilicon layer that is doped or undoped. The conductive layer 233 may comprise another doped or undoped semiconductive layer.

In some embodiments, the conductive layer 233 may comprise a metallic layer. The metallic layer may comprise a metallic material, such as a pure metal, an alloy and/or a compound. It is understood that any pure metal may include trace impurities. The metallic material may include one or more of the Periodic Table elements selected from the group consisting of Al (aluminum), Cu (copper), and Au (gold). Examples of possible metallic material which may be used include, without limitation, pure aluminum, aluminum alloy, aluminum compound, pure copper, copper alloy, copper compound, pure gold, gold alloy and gold compound.

Alternatively, the conductive layer 233 may comprise an otherwise conductive material.

The conductive layer 233 may be disposed on the dielectric layer 231. Alternatively, the dielectric layer 231 may be disposed on the conductive layer 233.

In one embodiment the backplate 230 comprises a sandwich structure, e.g., a stack of a dielectric layer 231, a conductive layer 233, and a dielectric layer 231 or a stack of a conductive layer 233, a dielectric layer 231 and a conductive layer 233. Alternatively, the backplate 230 comprises a stack comprising a plurality of conductive layers 233 and a plurality of dielectric layers 231.

In certain embodiments, the conductive layer 233 of the backplate has a thickness dC of about 1000 nm to about 2000 nm and a dielectric layer 231 having a thickness dD of about 100 nm to about 200 nm. The thickness dC of the conductive layer 233 is about 10 times larger than the thickness dD of the dielectric layer 231. In a particular embodiment, the thickness dC of the conductive layer 233 is about 1500 nm and the thickness dD of the dielectric layer 231 is about 140 nm. The top surface 230a of the backplate 230 is substantially planar for the anti-sticking bump 234 and the elongated protrusion 236. For example, the elongated protrusion 236 may comprise a T shape. The width wR of the elongated protrusion 236 may be chosen such that the top surface 230a of the backplate 230 is substantially planar.

The width wR of the elongated protrusion 236 may be chosen so that the width wR is less than or equal to twice the thickness of the backplate 230. The thickness of the backplate 230 may be the combined thickness of the conductive layer 233 (e.g. thickness dC) and dielectric layer 231 (e.g. thickness dD). The elongated protrusion 236 may be a ridge such as a stiffening ridge.

The height hR of the elongated protrusion 236 may be the same as the combined thickness of the conductive layer 233 and the dielectric layer 231 dC and dD. The height hR may be about 0.5 µm to about 1.5 µm and depends on the preform structure defined in the underlying sacrificial layer. The elongated protrusion 236 and the anti-sticking bump 234 are disposed on the side of the backplate 230 which faces the membrane 220.

In one or more embodiments, the backside 231a of the backplate 230, at the elongated protrusion 236, may be substantially flat, e.g., as shown in FIG. 2b. In one or more embodiments, there may be substantially no recess in the backside 231a of the backplate 230 at the elongated protrusion 236.

In one or more embodiments, the backside 231a of the backplate 230, at the anti-sticking bump 234, may be substantially flat. In one or more embodiments, there may be substantially no recess in the backside 231a of the backplate 230 at the anti-sticking bump 234. In the embodiment shown, the elongated protrusion 236 may comprise a T shape.

Figure 2C:
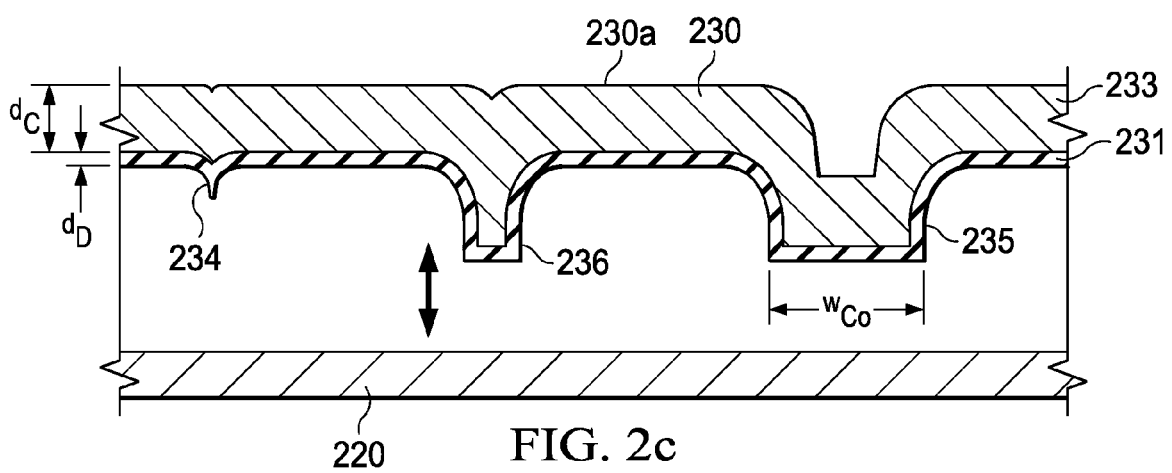

FIG. 2c shows a cross sectional view of a further embodiment of a portion of a backplate 230 and a membrane 220. FIG. 2c shows a backplate 230 similar to that in FIG. 2b but with an additional elongated protrusion 235. The elongated protrusion 235 may be a corrugation line. In the embodiment shown, the elongated protrusion 235 is wider than the elongated protrusion 236 and the anti-sticking bump 234. In the embodiment shown, the elongated protrusion 235 comprise a recess RES in the backside surface 230a of the backplate 230. The recess RES in the backside of the surface 230a comprise may comprise a U shape. Likewise, the elongated protrusion 235 may comprise a U shape. In one or more embodiments, the width wCo of the elongated protrusion 235 may be larger than twice the thickness of the backplate (e.g., the combined thickness of the conductive layer 233 and the dielectric layer 231 dC and dD).

The elongated protrusions 235, 236 may provide for increased stiffening of the backplate 230 in a direction along (e.g. parallel to) the direction of the elongation. Hence, they may make the backplate 230 stiffer in a direction parallel to the direction of the elongation. In the embodiment shown in FIG. 2c, the direction of elongation for each of elongated protrusion 235 and elongated protrusion 236 is perpendicular to the page. In one or more embodiments, the direction of the elongation may made to run in a direction which is radial on the backplate 230. This is shown, for example, in FIG. 2a which the elongated protrusion 236 on the anchor bridge 238 runs in a direction (that is, the elongation is in a direction) which is radial on the backplate.

The elongated protrusion 235 may make the backplate 230 more flexible in a direction that is perpendicular to the direction of the elongation. In one or more embodiments, the direction of elongation may run parallel to the backplate's 230 circumference (e.g., which may comprises a circle, a square or a star configuration). The elongated protrusion 236 may be configured to decouple the backplate 230 from the substrate and from substrate/body noise/vibration.

Figure 3A:
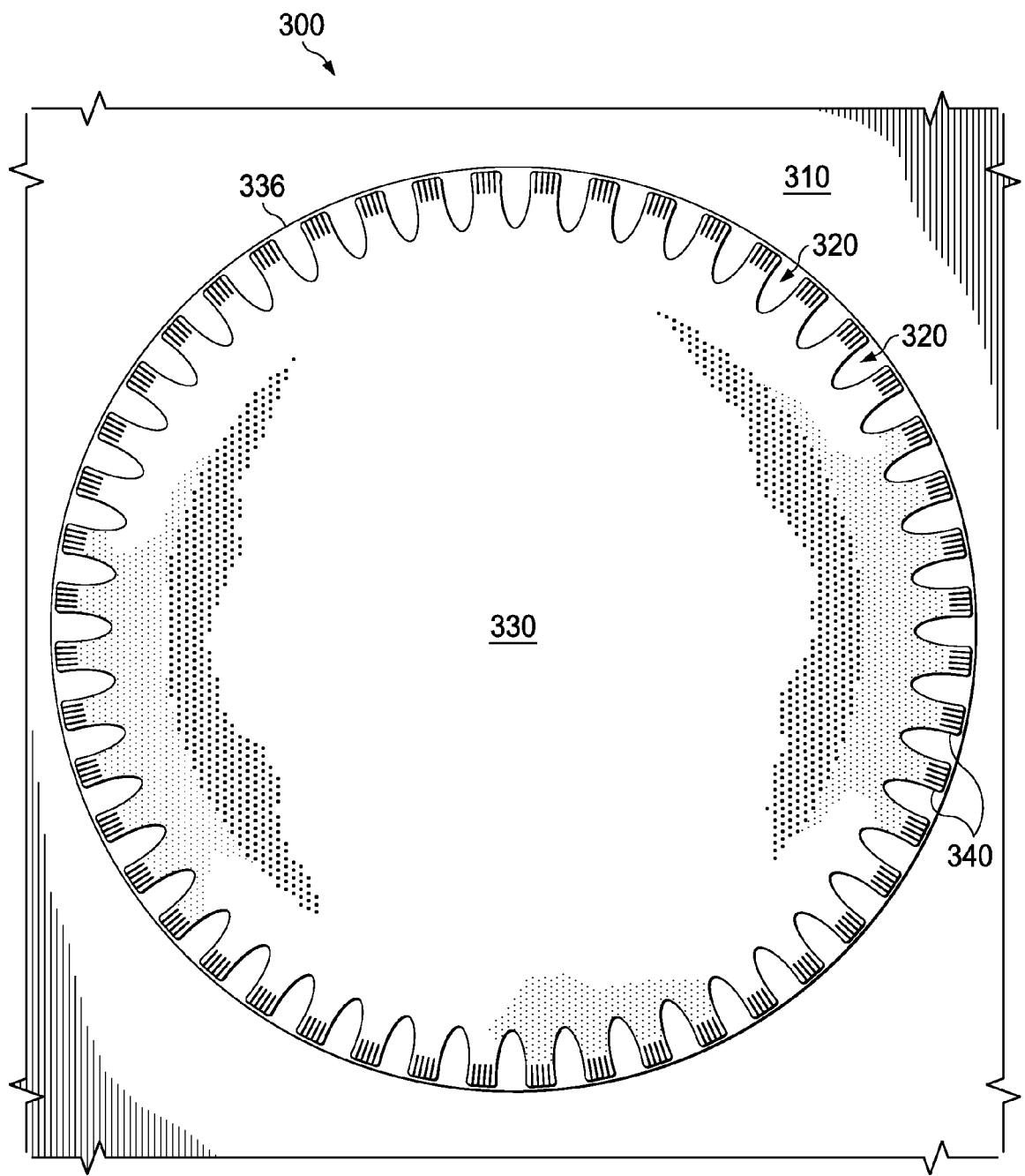
FIGS. 3a-3c show top views of an embodiment of a backplate with elongated protrusions.

FIG. 3a shows a top view of an embodiment of a MEMS structure 300. The backplate 330 and the membrane (not shown) are mechanically connected to a substrate 310 along their circumference. The membrane and the backplate 330 may comprise a circular like, a square like form or a star like form. Alternatively, the membrane and the backplate 330 may comprise any geometrical suitable form.

The membrane and the backplate 330 may be connected to the substrate 310 via an anchor region. The substrate 310 may further include active components such as transistors, diodes, capacitors, amplifiers, filters or other electrical devices. The substrate 310 may include an integrated circuit (IC). The MEMS structure 300 may be a stand-alone device or may be integrated with an IC into a single chip.

The membrane and the backplate 330 comprise a conductive material. The conductive material may comprise a polysilicon material such as a doped (or undoped) polysilicon. The conductive material may comprise a metallic material. The membrane and backplate may comprise a combination of materials. The membrane and backplate may comprise a combination of conductive layers with dielectric layers such as silicon nitride, silicon oxynitride, oxide (e.g. silicon oxide) or polymeric layers. The dielectric layer may be a tensile stress layer. The backplate 330 may be perforated to reduce damping effects when in operation.

The backplate 330 comprises cutouts 320 along the circumference 336 of the backplate 330. The cutouts 320 form anchor bridges 340 connecting the backplate 330 to the substrate 310. The cutouts 320 alternate with the anchor bridges 340. The cutouts 320 may comprise a parabola or a parabola like form. Alternatively, the cutouts 320 may comprise an oval, an oval like, a circular or a circular like form.

Figure 3B:
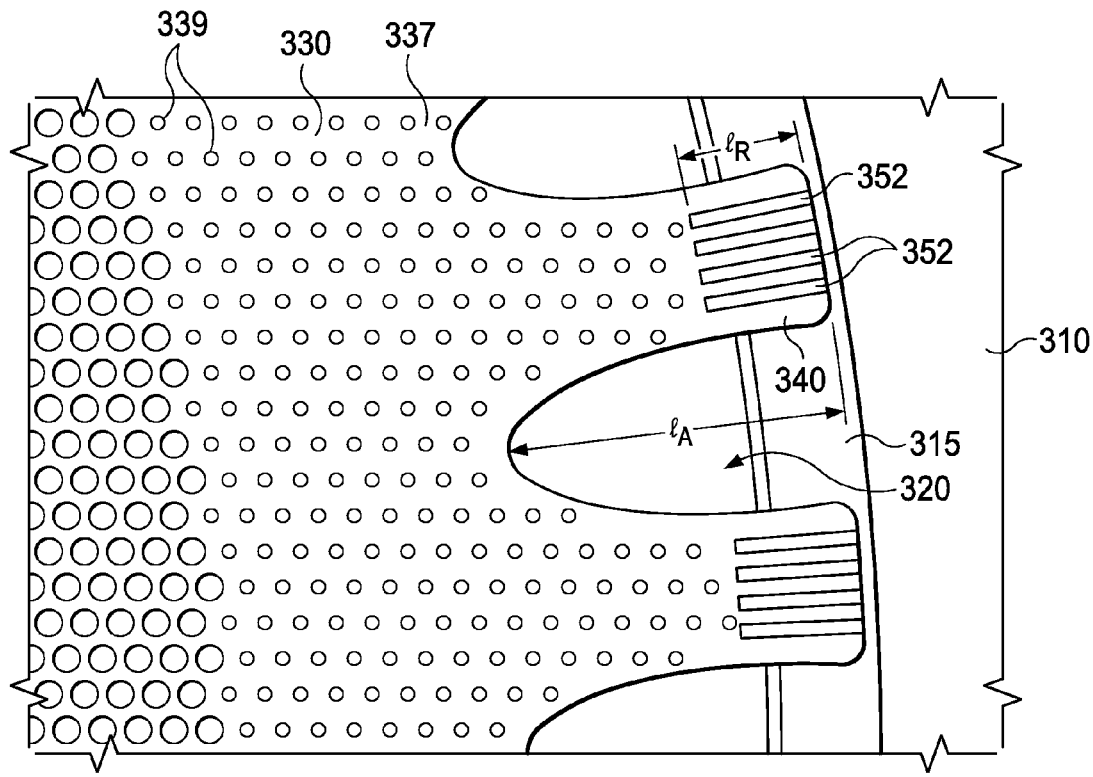

FIG. 3b shows a detailed view of the anchor bridges 340. Elongated protrusions 352 are disposed only on the anchor bridges 340. There are four elongated protrusions 352 per anchor bridge 340. Alternatively, there are other numbers of elongated protrusions 352 per anchor bridge 340. Moreover the elongated protrusions 352 comprise a length lR with less than half of the length lA of the anchor bridge 340. Alternatively the length lR of the elongated protrusions 352 may be as large as the length lA of the anchor bridges 340 or even longer. In other embodiments, the elongated protrusions 352 overlie the rim region 315 and the opening beneath the membrane and the backplate 330. The elongated protrusions 352 may be stiffening ridges, stiffening lines, stiffening routs, stiffening tracks or corrugation lines.

Figure 3C:
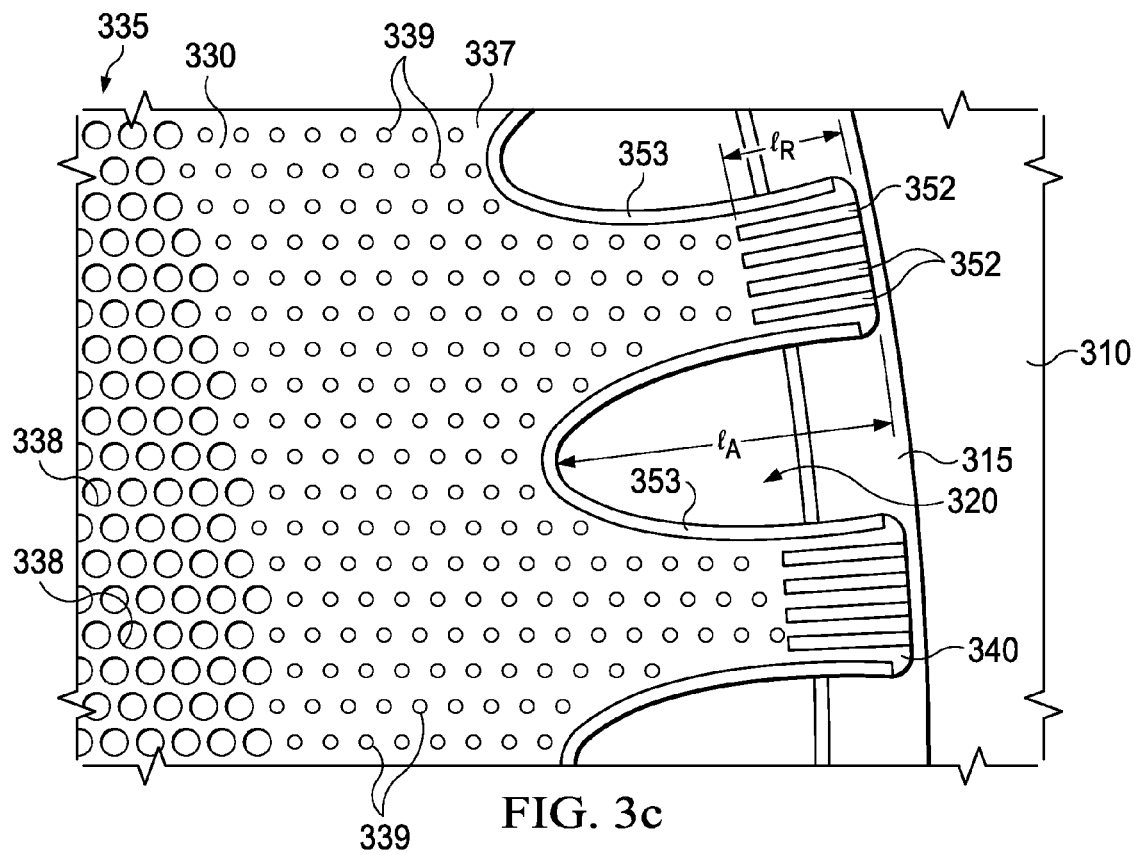

FIG. 3c shows elongated protrusions 352 disposed on the anchor bridges 340 and a peripheral region 337 of a central region 335 of the backplate 330. There are four elongated protrusions 352 per anchor bridge 340 and two elongated protrusions 353 connecting an anchor bridge 340 with the two neighboring anchor bridges 340. Alternatively, there are other numbers of elongated protrusions 352, 353 per anchor bridge 340. Moreover, the elongated protrusions 352 comprise a length lR having a length less than half of the length lA of the anchor bridge 340. Alternatively the length lR of the elongated protrusions 352 may be as large as the length lA of the anchor bridges 340 or even longer. In other embodiments, the elongated protrusions 352 overlie the rim region 315 and the opening beneath the membrane and the backplate 330. The elongated protrusions 352 are disposed along the circumference of the cutout 320 connecting neighboring anchor bridges 340.

The backplate 330 further comprises anti-sticking bumps 339 and anti-dampening openings 338. The anti-sticking bumps 339 may comprise a circular, a rectangular or a square region with a protruding portion. The protruding portion may be a middle tip or middle point. The elongated protrusions 352 may be a stiffening ridge, a stiffening line, a stiffening route, a stiffening track or a corrugation line. The elongated protrusion 352 and the anti-sticking bumps 339 may be planar on the backside. The anti-sticking bumps 239 are be elongated protrusions.

Figure 4A:
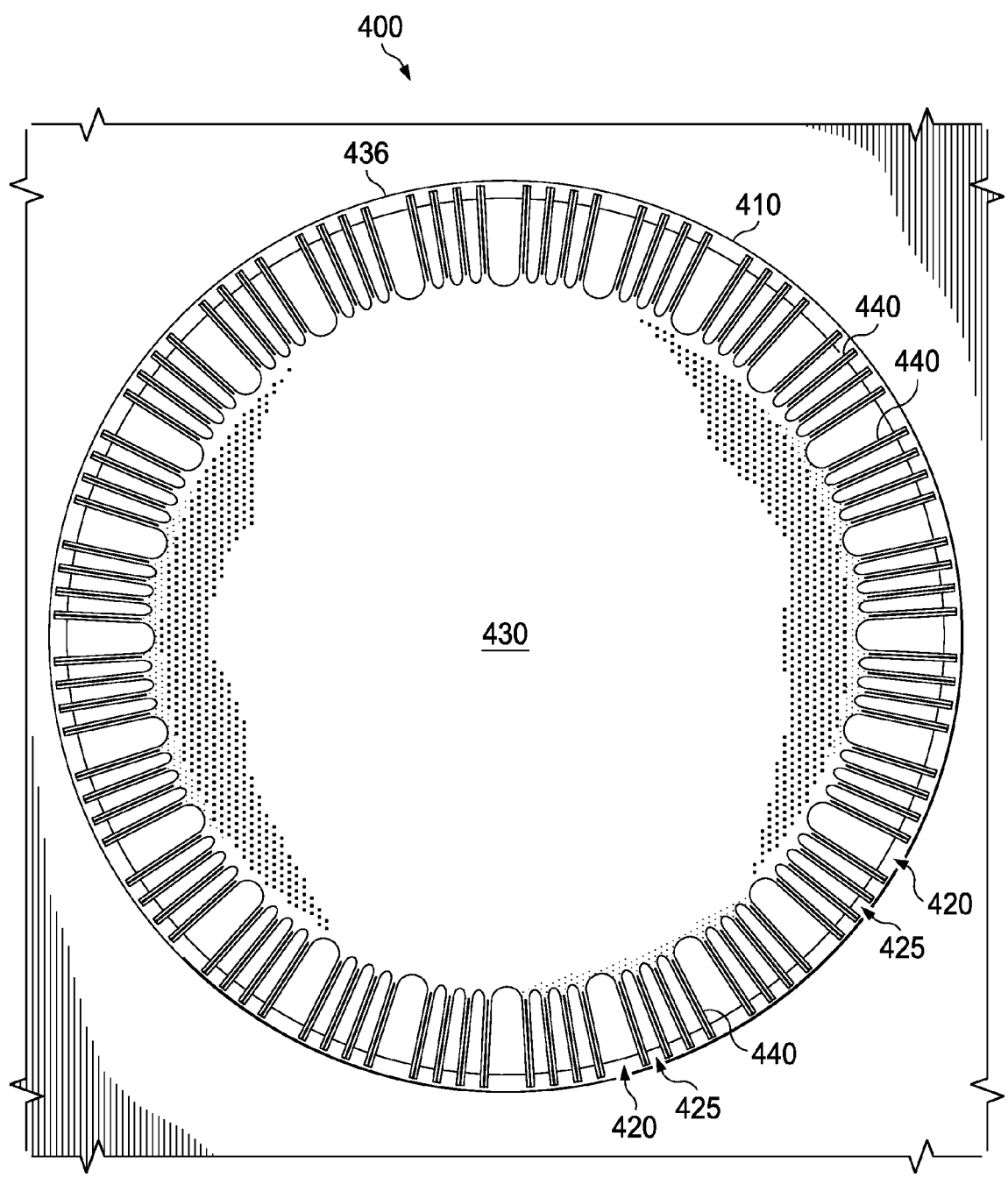
FIGS. 4a-4c show top views of an embodiment of a backplate with elongated protrusions.

FIG. 4a shows a top view of an embodiment of a MEMS structure 400. The backplate 430 and the membrane (not shown) are mechanically connected to a substrate 410 along their circumference 436. The membrane and the backplate 430 may comprise a circular like or a square like form. Alternatively, the membrane and the backplate 430 may comprise any geometrical suitable form.

The membrane and the backplate 430 may be connected to the substrate 410 via an anchor region. The substrate 410 may further include active components such as transistors, diodes, capacitors, amplifiers, filters or other electrical devices. The substrate 410 may include an integrated circuit (IC). The MEMS structure 400 may be a stand-alone device or may be integrated with an IC into a single chip.

The membrane and/or the backplate 430 may comprise the conductive material layer and the dielectric layer as described with respect to FIG. 3*a*.

The backplate 430 comprises large cutouts 420 and small cutout 425 along the circumference 436 of the backplate 430. The cutouts 420, 425 form anchor bridges 440 connecting the backplate 430 to the substrate 410 (the anchor bridges 440 are part of the backplate 440). The cutouts 420, 425 alternate with the anchor bridges 440. The cutouts 420, 425 may comprise a parabola or a parabola like form. Alternatively, the cutouts 420, 425 may comprise an oval, an oval like, a circular or a circular like form. The anchor bridges 440 are grouped into groups of four. Alternatively, the anchor bridges 440 are grouped into groups of other natural numbers. The cutouts 425 separate the individual anchor bridges from each other within the group and the cutout 420 separate each group from each other.

Figure 4B:
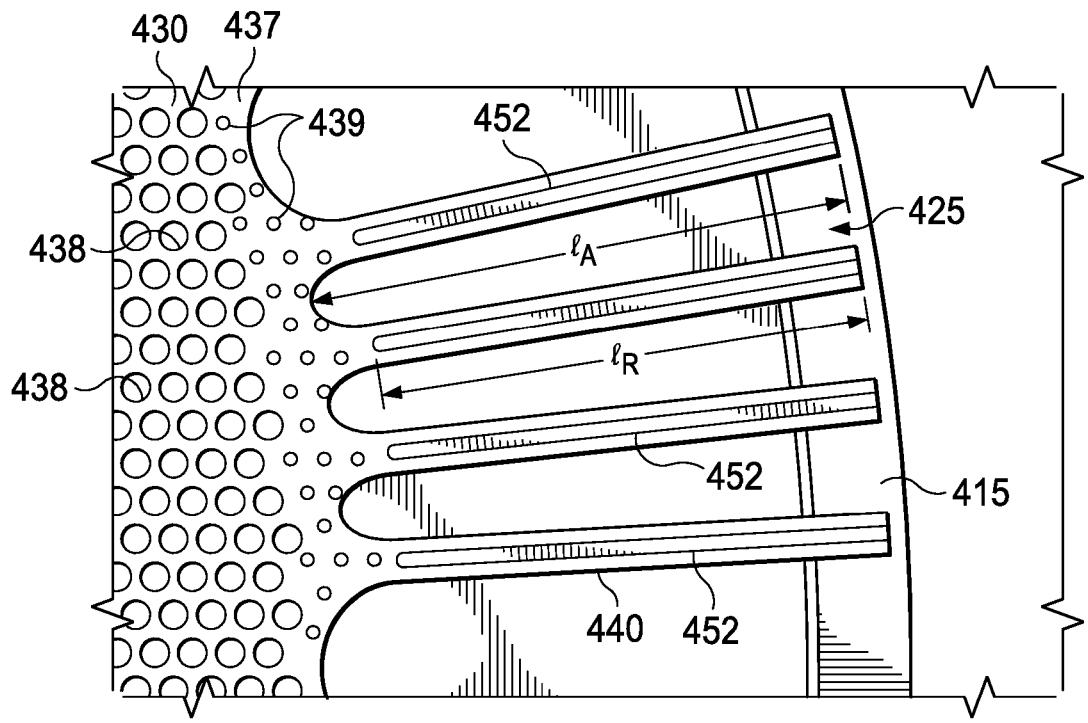

FIG. 4*b* shows a single elongated protrusion 452 disposed on a single anchor bridge 440. The elongated protrusion 452 comprises a length lR which is about the same as length lA of the anchor bridge 440. Alternatively the length lR of the elongated protrusion 452 is between a half and a full length of the length lA of the anchor bridges 440. In one embodiment, the elongated protrusion 452 overlies the rim region 415 and the opening beneath the membrane and the backplate 430.

Figure 4C:
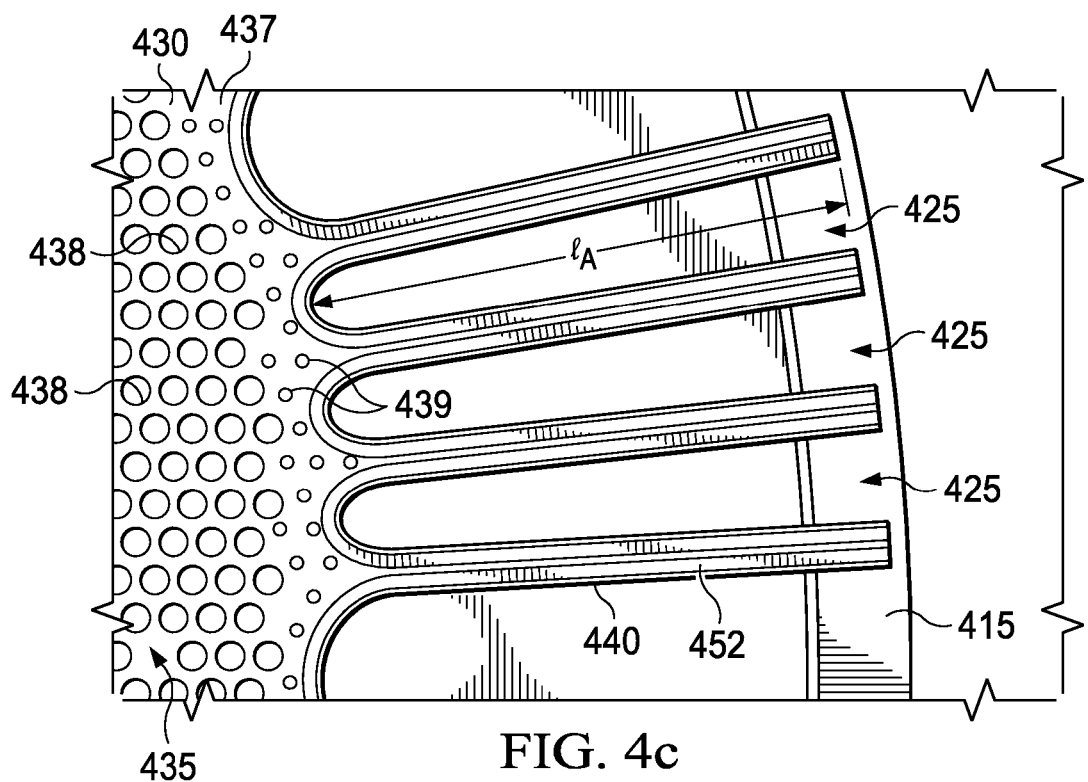

FIG. 4*c* shows two elongated protrusions 452 per anchor bridge 440. Each elongated protrusion 452 overlies anchor bridges 440, and a peripheral region 437 of a central region 435 of the backplate 430. In one embodiment the elongated protrusion 452 are disposed over the entire length lA of the anchor bridge 440. In other embodiments, the elongated protrusions 452 overlie the rim region 415 and the opening beneath the membrane and the backplate 430. The elongated protrusions 452 are disposed along the circumference of the cutout 425 connecting neighboring anchor bridges 440. The elongated protrusions 452 in the anchor bridge 440 at the end of a group of four may or may not be extended to the next anchor bridge 440 of the next group of four.

The backplate 430 further comprises anti-sticking bumps 439 and anti-dampening openings 438. The anti-sticking bumps 439 may comprise a circular, a rectangular or a square region with a protruding portion. The protruding portion may be a middle tip or middle point. The elongated protrusion 452 may be a stiffening ridge, a stiffening route, a stiffening track or a corrugation line. The elongated protrusion 452 and the anti-sticking bumps 439 may be planar on the backside of the backplate 430.

In one embodiment the anchor bridges 440 are about 5 μm to about 10 μm wide and about 100 μm long. The cutouts 425 may be about 10 μm to about 20 μm wide, the backplate 430 may be about 1 μm to about 2 μm thick (e.g., about 1.64 μm thick), the elongated protrusion 452 width may be 2× backplate 430 thickness (e.g., about 1 μm to about 3 μm) and elongated protrusion height may be about 1 μm to about 2 μm.

Figure 5A:
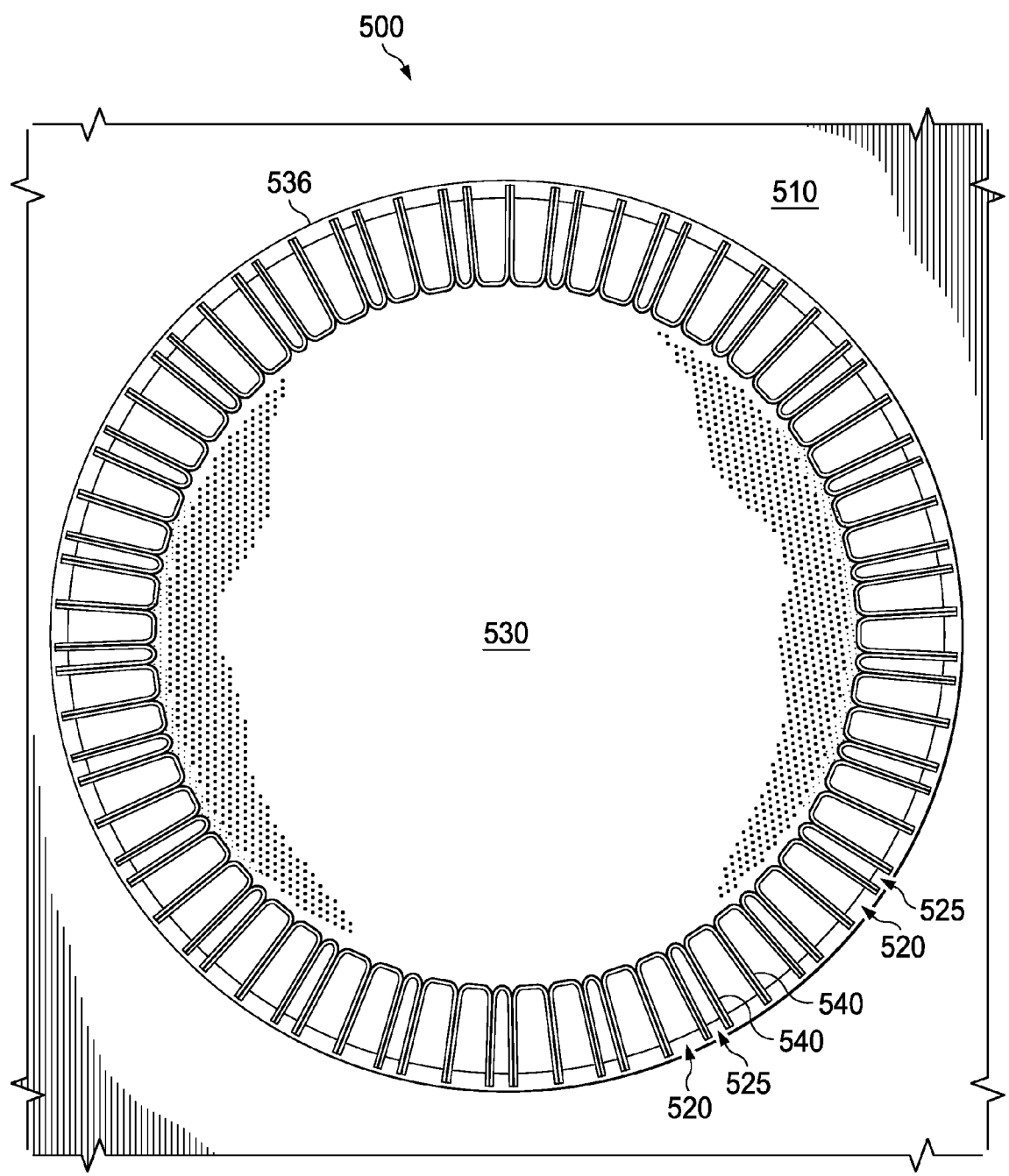
FIGS. 5a and 5b show top views of an embodiment of a backplate with elongated protrusions.

FIG. 5*a* shows a top view of an embodiment of a MEMS structure 500. The backplate 530 and the membrane (not shown) are mechanically connected to a substrate 510 along their circumference 536. The membrane and/or the backplate 530 may comprise a circular like, a square like form or a star like form. Alternatively, the membrane and the backplate 530 may comprise any geometrical suitable form.

The membrane and the backplate 530 may be connected to the substrate 510 via an anchor region. The substrate 510 may further include active components such as transistors, diodes, capacitors, amplifiers, filters or other electrical devices. The substrate 510 may include an integrated circuit (IC). The MEMS structure 500 may be a stand-alone device or may be integrated with an IC into a single chip.

The membrane and/or the backplate 530 may comprise the conductive material layer and the dielectric layer as described with respect to FIG. 3*a*.

The backplate 530 comprises large cutouts 520 and small cutouts 525 along the circumference 536 of the backplate 530. The cutouts 520, 525 form anchor bridges 540 connecting the backplate 530 to the substrate 510 (the anchor bridges 540 are part of the backplate 530). The cutouts 520, 525 alternate with the anchor bridges 540. The small cutouts 525 may comprise a parabola or a parabola like form. Alternatively, the small cutouts 525 may comprise an oval, an oval like, a circular or a circular like form. The large cutouts 520 may comprise a rectangular or rectangular like form. Alternatively, the large cutouts 520 may comprise a parabola, a parabola like, an oval, an oval like, a circular or a circular like form.

The anchor bridges 540 are grouped into groups of two (2) and individual anchor bridges 540. Alternatively, the groups may comprise any other natural number of anchor bridges 540 and the individual anchor bridges 540 may comprise a plurality of anchor bridges 540. The cutouts 525 separate the individual anchor bridges from each other within the group and the cutout 520 separate the groups from the individual bridges 540.

Figure 5B:
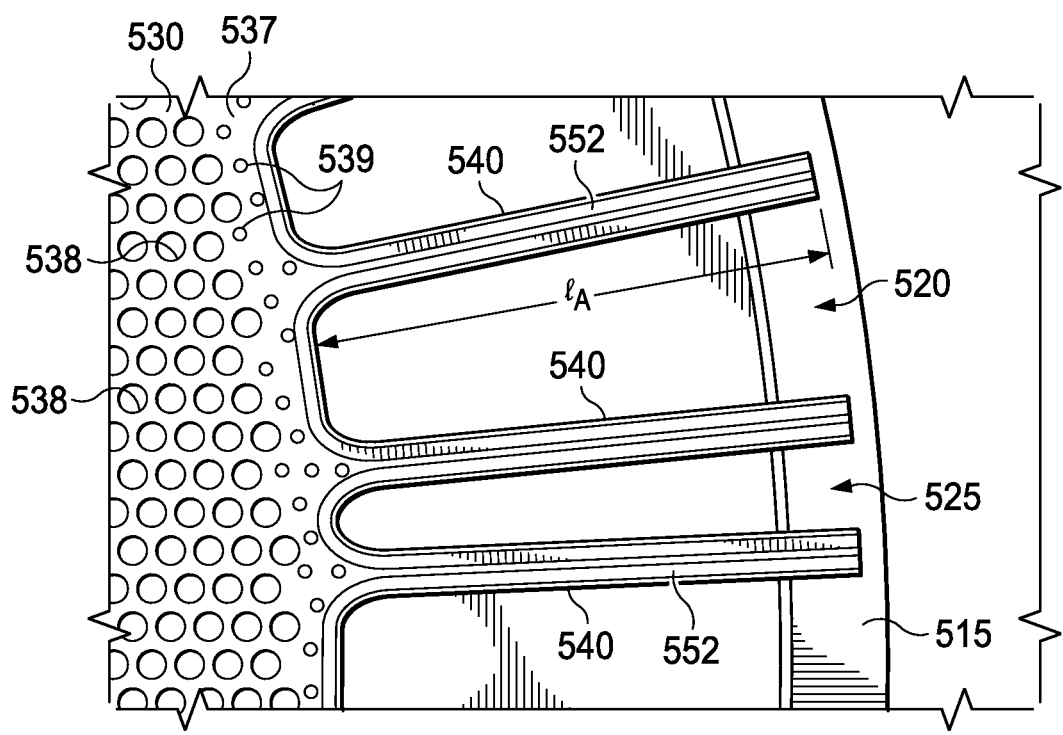

FIG. 5*b* shows two elongated protrusions 552 per anchor bridge 540. Each elongated protrusion 552 overlies the anchor bridges 540, a peripheral region 537 of a central region of the backplate 530. In one embodiment the elongated protrusions 552 are disposed over the entire length lA of the anchor bridge 540. In other embodiments, the elongated protrusions 552 overlie the rim region 515 and the opening beneath the membrane and the backplate 530. The elongated protrusions 552 are disposed along the circumference of the cutouts 520, 525 connecting neighboring anchor bridges 540.

The backplate 530 further comprises anti-sticking bumps 539 and anti-dampening openings 538. The anti-sticking bumps 539 may comprise a circular, a rectangular or a square region with a protruding portion. The protruding portion may be a middle tip or middle point. The elongated protrusions 552 may be a stiffening ridge, a stiffening line, a stiffening route, stiffening track or a corrugation line. The elongated protrusions 552 and the anti-sticking bumps 539 may be planar on the backside of the backplate 530. The dimensions of the elongated protrusions, cutouts and the anchor bridges may comprise the same dimensions as before except for the large cutout which is between about 20 μm to about 60 μm wide.

Figure 6A:
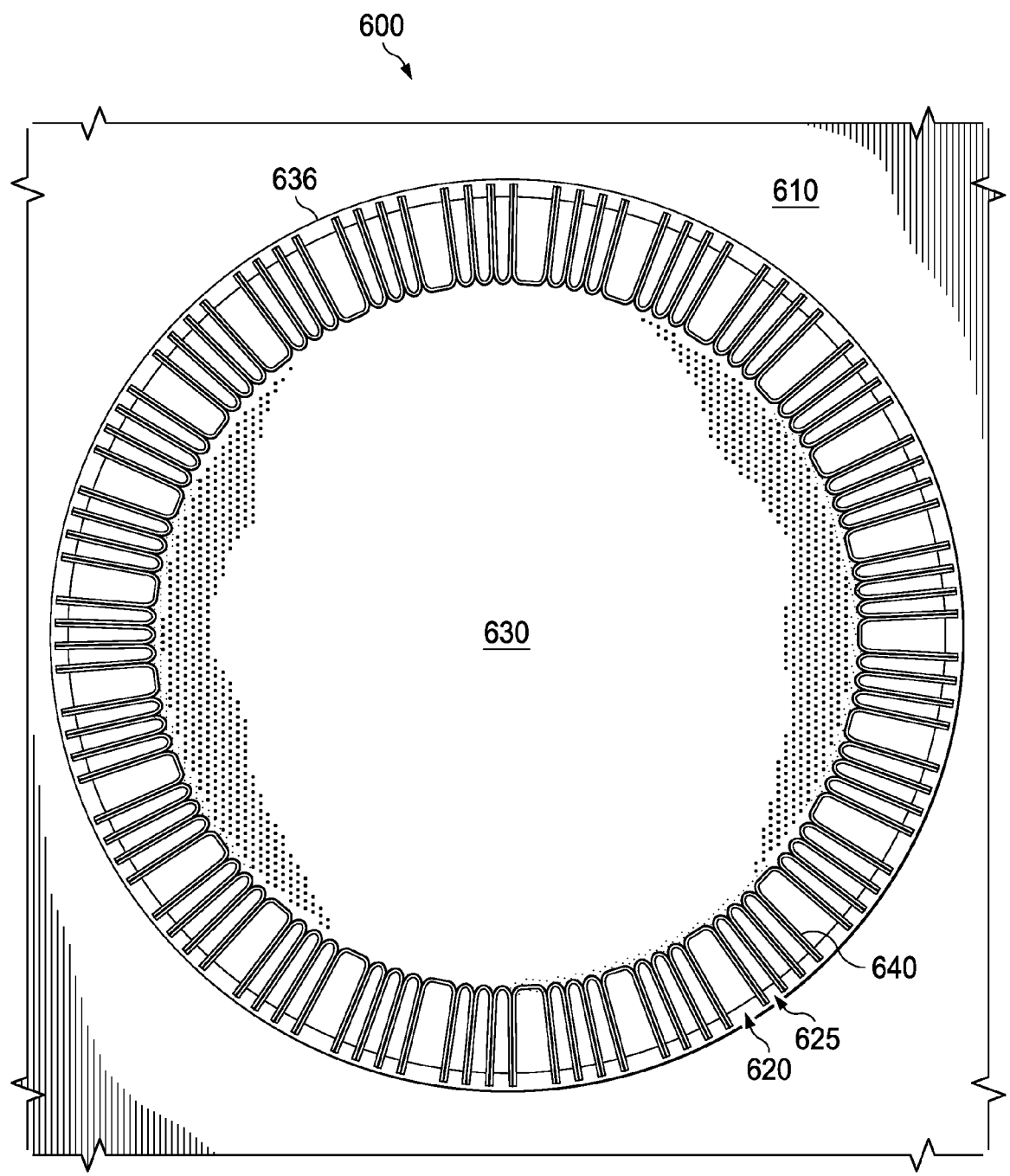
FIGS. 6a-6d show top views of an embodiment of a backplate with elongated protrusions.

FIG. 6*a* shows a top view of an embodiment of a MEMS structure 600. The backplate 630 and the membrane (not shown) are mechanically connected to a substrate 610 along their circumference 636. The membrane and/or the backplate 630 may comprise a circular like, a square like form or a star like form. Alternatively, the membrane and the backplate 630 may comprise any geometrical suitable form.

The membrane and the backplate 630 may be connected to the substrate 610 via an anchor region. The substrate 610 may further include active components such as transistors, diodes, capacitors, amplifiers, filters or other electrical devices. The substrate 610 may include an integrated circuit (IC). The MEMS structure 600 may be a stand-alone device or may be integrated with an IC into a single chip.

The backplate 630 and/or the membrane may comprise the conductive material layer and the dielectric layer as described with respect to FIG. 3a.

The backplate 630 comprises large cutouts 620 and small cutout 425 along the circumference 636 of the backplate 630. The cutouts 620, 625 form anchor bridges 640 connecting the backplate 630 to the substrate 610 (the anchor bridges 640 are part of the backplate 640). The cutouts 620, 625 alternate with the anchor bridges 640. The cutouts 620, 625 may comprise a rectangular or a rectangular like and/or parabola or a parabola like form. Alternatively, the cutouts 620, 625 may comprise an oval, an oval like, a circular or a circular like form. The anchor bridges 640 are grouped into groups of four (4). Alternatively, the anchor bridges 640 are grouped into group of other natural numbers. The cutouts 625 separate the individual anchor bridges from each other within the group and the cutout 620 separate each group from each other. In various embodiments the cutouts 620, 625 may comprise the same dimensions.

Figure 6B:
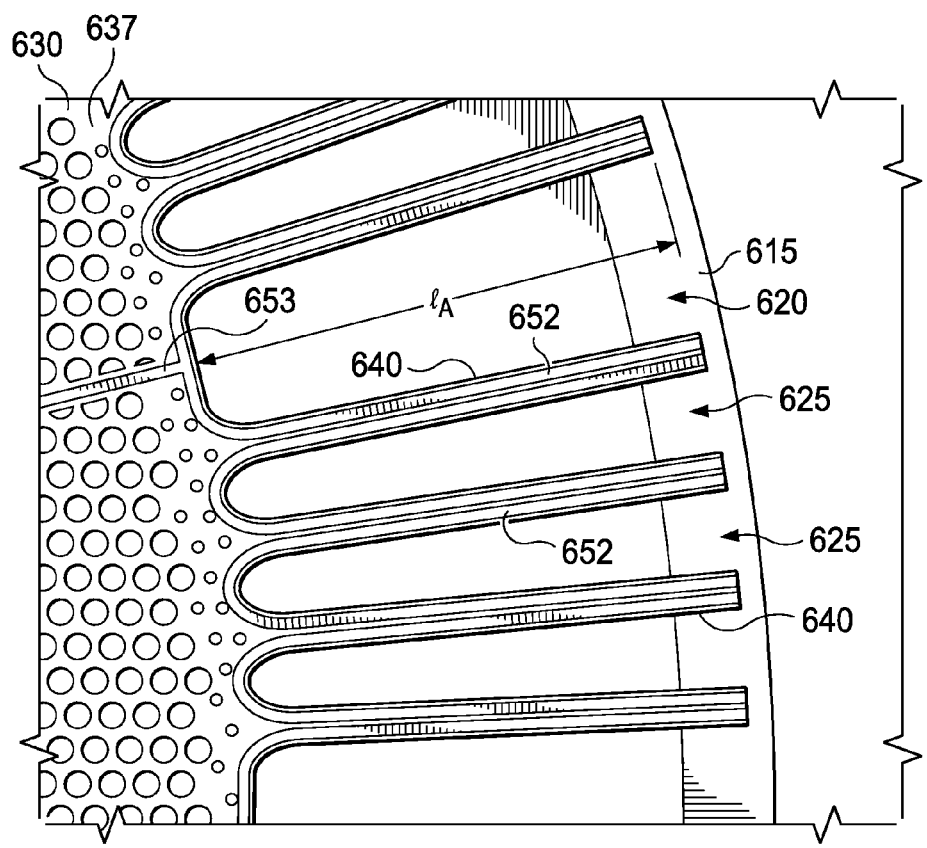

FIG. 6b shows two elongated protrusions 652 per anchor bridge 640. Each elongated protrusion 652 overlies anchor bridges 640, a peripheral region 637 of a central region of the backplate 630. In one embodiment the elongated protrusions 652 are disposed over the entire length 1A of the anchor bridge 640. In other embodiments, the elongated protrusions 652 overlie a portion of the anchor bridge 640 such as the rim region 615 and a portion of the opening beneath the membrane and the backplate 630. The elongated protrusions 652 are disposed along the circumference of the cutout 625 connecting neighboring anchor bridges 640. The elongated protrusions 652 in the anchor bridge 640 at the end of a group of four may or may not be extended to the next anchor bridge 640 of the next group of four.

Figure 6C:
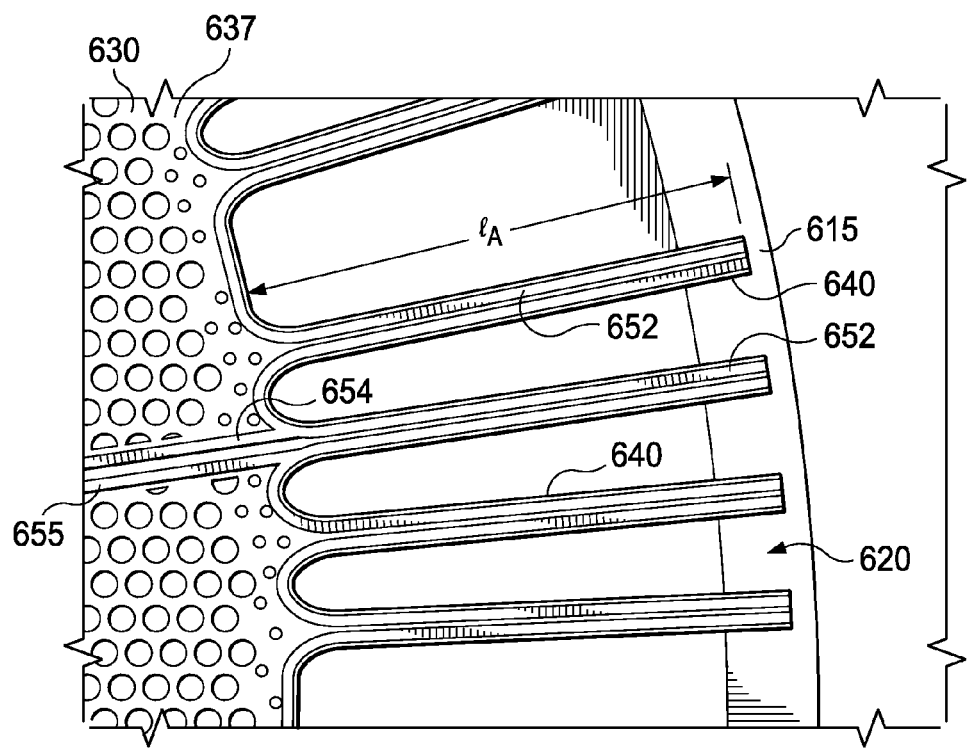

FIG. 6c shows two elongated protrusions 652 per anchor bridge 640. Each elongated protrusions 652 overlies anchor bridges 640, a peripheral region 637 of a central region of the backplate 630. In one embodiment the elongated protrusions 652 are disposed over the entire length 1A of the anchor bridge 640. In other embodiments, the elongated protrusions 652 overlie only a portion of the anchor bridge 640 such as the rim region 615 and a portion of the opening beneath the membrane and the backplate 630. The elongated protrusions 652 are disposed along the circumference of the cutout 620 connecting neighboring anchor bridges 640.

Figure 6D:
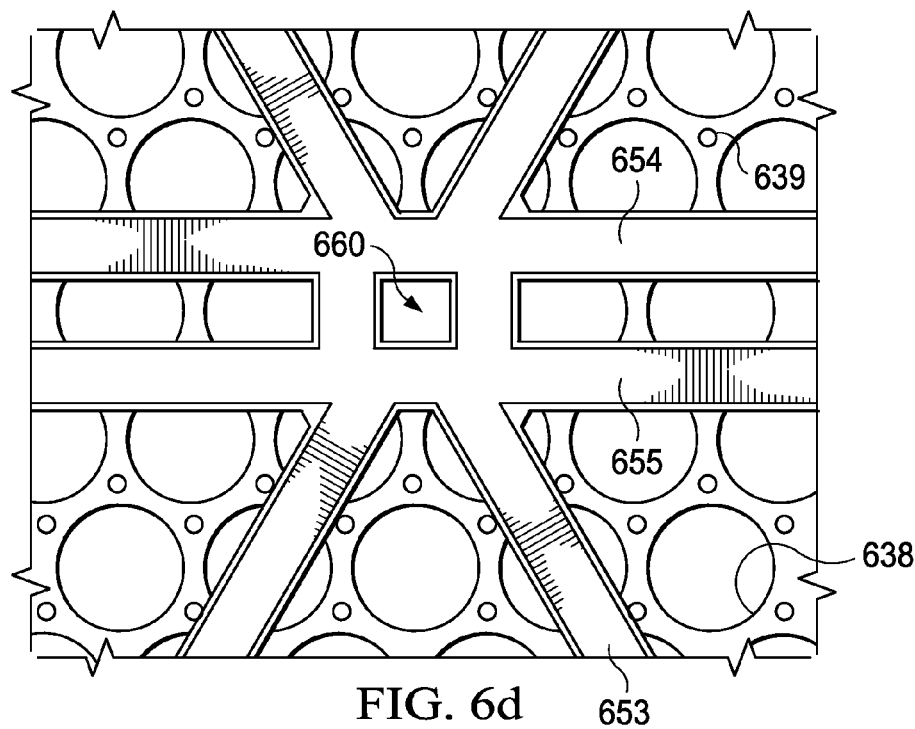

FIGS. 6b-6d show the elongated protrusions 653-655 extended towards the center of the backplate 630. For example, the elongated protrusions 654, 655 of FIG. 6c extend from the anchor bridge 640 to the center 660 of the backplate 630 as shown in FIG. 6d and the elongated protrusions 653 of FIG. 6b extends from the center of the cutout 620 to the center 660 of the backplate 630. In one embodiment, only double elongated protrusions 654, 655 such as shown in FIG. 6c cross the center 660 of the backplate 630. In an alternative embodiment only single elongated protrusions 653 such as shown in FIG. 6d cross the center 660 of the backplate 630.

In various embodiments the elongated protrusions on the anchor bridge 652 which do not connect neighboring anchor bridges 640 extend towards the center of the backplate. In other embodiments various configurations of elongated protrusions 652-655 may cross the center 660 of the backplate 630.

The backplate 630 further comprises anti-sticking bumps 639 and anti-dampening openings 638 as shown in FIG. 6d, for example. The anti-sticking bumps 639 may comprise a circular, a rectangular or a square region with a protruding portion. The protruding portion may be a middle tip or middle point. The elongated protrusions 652-655 may comprise stiffening ridges, stiffening lines, stiffening routes, stiffening tracks or corrugation lines. The elongated protrusions 652-655 and the anti-sticking bumps 639 may be planar on the backside of the backplate 630. The dimensions of the elongated protrusions, cutouts and the anchor bridges may comprise the same dimensions as described in previous embodiment except for the large cutout which is between about 20 µm to about 60 µm wide.

Figure 7:
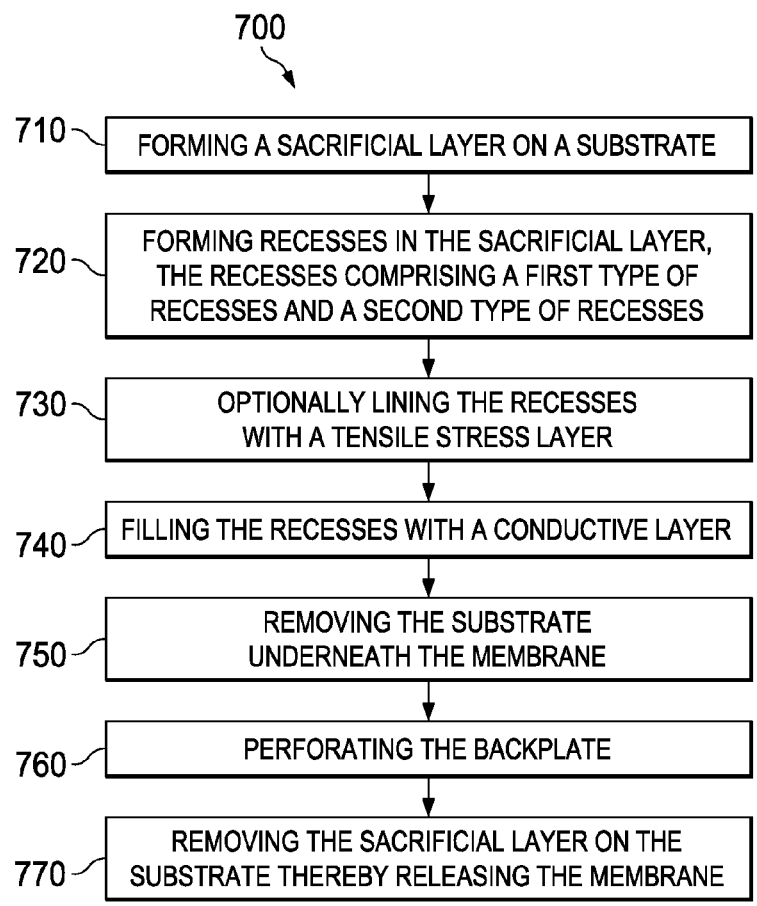
FIG. 7 shows a flow chart of an embodiment of a method for manufacturing a MEMS structure.

FIG. 7 shows an embodiment of a method 700 to manufacture a MEMS structure. In step 710 a sacrificial layer is formed on a substrate. The substrate may comprise a bulk mono-crystalline silicon substrate (or a layer grown thereon or otherwise formed therein), a layer of {110} silicon, a layer of {100} silicon, a silicon-on-insulator (SOI), or a germanium-on-insulator (GeOI). In various embodiments, the substrate may include a blanket epitaxial layer. The substrate may comprise a compound semiconductor substrate such as indium antimonide, indium arsenide, indium phosphide, gallium nitride, gallium arsenide, gallium antimonide, lead telluride, silicon germanium, silicon carbide or combinations thereof or glass.

The sacrificially layer comprises a dielectric material. For example, the sacrificial layer may be an oxide such as a silicon oxide, a nitride such as a silicon nitride, another isolating material or combinations thereof. In one particular example, the sacrificial layer is tetraethyl orthosilicate (TEOS).

In step 720 openings/recesses are formed in the sacrificial layer. The recesses may comprise first type of recess (e.g., small recesses such as anti-sticking bumps) and a second type of recess (e.g., larger recesses such stiffening ridges). In an optional embodiment the recesses may further comprise a third type of recess (e.g., largest recesses such as corrugation lines). The recesses may comprise the same depth. For example, the depth of the recesses may be 300 nm to 3000 nm. Alternatively, the depths of the recesses are different for each type of opening. The first type of recess may be circular, oval or rectangular holes. The second type of recesses may comprise trench lines. The first type of recess comprises a width of about 300 nm to about 1500 nm and the second type of recess comprises a width of about 1500 nm to about 3000 nm. The width of the second type of recess may be chosen such that the top surface of the backplate is substantially planar.

The recesses are formed in the sacrificial layer with a directional etch. A dry etch process or a wet etch process is applied. In one particular example, the openings are etched with an RIE. The recess may be lined with a further sacrificial layer of conformal coating to generate round corners at the upper edge of the opening.

In the optional step 730 the recesses are lined with a dielectric layer. The dielectric layer may comprise dielectric material such as silicon nitride, silicon oxynitride, silicon oxide or a polymeric. The dielectric layer may be configured to provide tensile stress. The dielectric layer may conformal overlie the bottom surfaces and the sidewalls of the recesses and the top surface of the sacrificial layer. The dielectric layer does not fill the recesses completely.

In step 740, a conductive layer is formed over the dielectric layer (otherwise over the sacrificial layer). The conductive layer may be silicon layer such as polysilicon, in-situ doped polysilicon or otherwise doped or undoped semiconductive layer. Alternatively, the conductive layer may be a metal layer.

The conductive layer may comprise a plurality of layers. The conductive layer and the optional dielectric layer form a backplate. In one embodiment the formation of the dielectric layer and the conductive layer is repeated to form a layer stack.

The conductive layer fills the opening and overlies the dielectric layer. The conductive layer may be substantially planar over the small openings and the midsize openings. The conductive layer may form a recess over the backside of the large size openings.

In one embodiment the conductive layer comprises a thickness of about 1000 nm to about 2000 nm and the dielectric layer comprises a thickness of about 100 nm to about 200 nm. The thickness of the conductive layer is about 10 times larger than the thickness of the dielectric layer. In a particular embodiment, the thickness of the conductive layer is about 1600 nm and the thickness of the dielectric layer is about 140 nm. The top surface of the backplate is substantially planar for the first and the second type of recesses. The height of the second type of recesses depends on the depth etched into the sacrificial layer formed in step 720 and is about 0.5 μm to about 2 μm.

In step 750 the substrate is removed underneath the backplate. The substrate may be removed applying a Bosch™ etch process. The Bosch™ etch process may comprise repeating the following steps: 1) isotropic etching such as a dry etching the substrate (wafer), 2) depositing a polymeric film over the substrate (wafer) and the bottom surface and the sidewalls of the trench formed by the first etch step, and 3) opening the polymeric film over the substrate (wafer) and the bottom surface of the trench but not along the sidewalls so that step 1) can again be applied.

In step 760 the backplate (conductive layer and the optional dielectric layer) is perforated with a directional etch. The sacrificial layer is the etch stop layer.

In step 770, the sacrificial layer is removed underneath the backplate. Anti-sticking bumps may be formed from the first type of recesses and the elongated protrusions may be formed form the second type of recesses. An isotropic etch process may be applied to remove the sacrificial layer through the perforation in the backplate. The membrane is released by removing the sacrificial layer. The anchor regions can be formed by controlling the timing of the isotropic etching or by providing a covering such as a photo resist or passivation nitride across the anchor region avoiding the undercutting at this position.

Although the present invention and its advantages have been described in detail, it should be understood that various changes, substitutions and alterations can be made herein without departing from the spirit and scope of the invention as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A device comprising:
    a substrate; and
    a backplate supported by the substrate, wherein the backplate comprises
        a center region,
        elongated protrusions, and
        anchor bridges connected to the substrate, wherein the elongated protrusions are disposed on the anchor bridges.

2. The device according to claim 1, wherein each anchor bridge comprises a radial elongated protrusion.

3. The device according to claim 1, wherein two neighboring anchor bridges comprise a continuous elongated protrusion.

4. The device according to claim 1, wherein each anchor bridge comprises a short elongated protrusion, the short elongated protrusion being disposed only on the anchor bridge, and a long elongated protrusion, the long elongated protrusion being connected to a neighboring anchor bridge.

5. The device according to claim 1, wherein the elongated protrusions are disposed on areas of the backplate with maximum stress concentration.

6. The device according to claim 1, wherein the substrate comprises a rim, and wherein the elongated protrusions overlie a portion of the rim.

7. The device according to claim 1, wherein the device is a microphone.

8. A device comprising:
    a substrate; and
    a backplate supported by the substrate, wherein the backplate comprises elongated protrusions and anti-sticking bumps.

9. A MEMS structure comprising:
    a movable electrode supported by a substrate; and
    a counter electrode supported by the substrate, wherein the counter electrode comprises elongated protrusions extending towards the movable electrode from a major surface of the counter electrode.

10. The MEMS structure according to claim 9, wherein the counter electrode comprises a plurality of anchor bridges, the anchor bridges connecting the counter electrode to the substrate.

11. The MEMS structure according to claim 9, wherein the movable electrode is a membrane of a silicon microphone and the counter electrode is a backplate of the silicon microphone.

12. The MEMS structure according to claim 9, wherein the MEMS structure is a microphone.

13. A MEMS structure comprising:
    a movable electrode supported by a substrate; and
    a counter electrode supported by the substrate, wherein the counter electrode comprises elongated protrusions, wherein the counter electrode further comprises anti-sticking bumps.

14. A MEMS structure comprising:
    a movable electrode supported by a substrate; and
    a counter electrode supported by the substrate, wherein the counter electrode comprises elongated protrusions, wherein the elongated protrusions are disposed in anchor bridges connecting the counter electrode to the substrate.

15. A MEMS structure comprising:
    a movable electrode supported by a substrate; and
    a counter electrode supported by the substrate, wherein the counter electrode comprises elongated protrusions, wherein each elongated protrusion connects neighboring anchor bridges.

16. A MEMS structure comprising:
    a movable electrode supported by a substrate; and a counter electrode supported by the substrate, wherein the counter electrode comprises elongated protrusions, wherein at least one of the elongated protrusions connect an opposite anchor bridge.

17. A MEMS structure comprising:
a movable electrode supported by a substrate; and
a counter electrode supported by the substrate, wherein the counter electrode comprises elongated protrusions, wherein the elongated protrusions are disposed in a center portion of the counter electrode.

* * * * *